United States Patent [19]
Biscay et al.

[11] Patent Number: 6,092,588
[45] Date of Patent: Jul. 25, 2000

[54] INDOOR MOUNTING ARRANGEMENT FOR WIRELESS SYSTEMS

[75] Inventors: Alejandro Fernandez Biscay; Angel Silvera Garcia, both of Buenos Aires, Argentina; Richard Alan Warncke, Freehold, N.J.

[73] Assignee: Lucent Technologies Inc., Murray Hill, N.J.

[21] Appl. No.: 09/168,448

[22] Filed: Oct. 8, 1998

Related U.S. Application Data

[63] Continuation-in-part of application No. 09/118,239, Jul. 17, 1998.

[51] Int. Cl.[7] .................................................. F28D 11/06
[52] U.S. Cl. .................... 165/86; 165/185; 248/276.1; 248/278.1
[58] Field of Search ................ 165/47, 80.2, 185, 165/45; 174/16.3; 248/278.1, 276.1, 291.1, 289.11

[56] References Cited

U.S. PATENT DOCUMENTS

| | | | |
|---|---|---|---|
| 357,337 | 2/1887 | Rosenblatt | 248/276.1 |
| 1,063,220 | 6/1913 | Seamon | 248/278.1 |
| 1,328,677 | 1/1920 | La Hodny | 248/278.1 |
| 3,157,379 | 11/1964 | Platakis | 248/278.1 |
| 4,183,489 | 1/1980 | Copher et al. | 248/278.1 |
| 4,872,630 | 10/1989 | Cooper | 248/278.1 |
| 5,127,617 | 7/1992 | Bergetz | 248/278.1 |
| 5,201,896 | 4/1993 | Kruszewski | 248/278 |
| 5,667,179 | 9/1997 | Rosen | 248/278.1 |
| 5,683,064 | 11/1997 | Copeland et al. | 248/278.1 |
| 5,842,672 | 12/1998 | Sweere et al. | 248/278.1 |
| 5,890,690 | 4/1999 | Klingtberg | 248/276.1 |

*Primary Examiner*—Ira S. Lazarus
*Assistant Examiner*—Terrell McKinnon
*Attorney, Agent, or Firm*—Gibbons, Del Del, Dolan, Griffinger & Vecchione

[57] ABSTRACT

A bracket for mounting an electronic instrument upon a generally horizontal surface has a base member having an outer surface and an opposite mounting surface for mounting the base member on the horizontal surface. The bracket also has a support member having an outer surface and an opposite mounting surface for mounting the support member on the electronic instrument. The bracket further has an intermediate member extending between the base member and the support member. The intermediate member is pivotally attached to the support member.

22 Claims, 10 Drawing Sheets

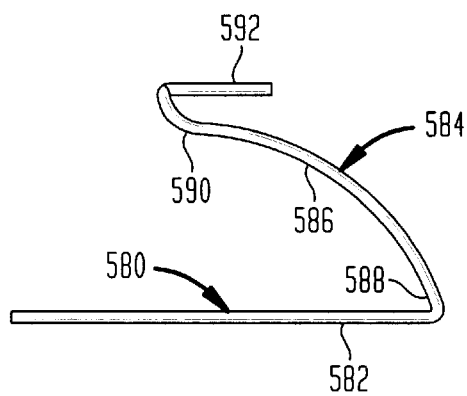
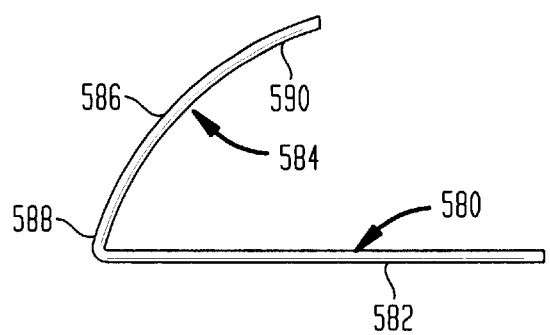
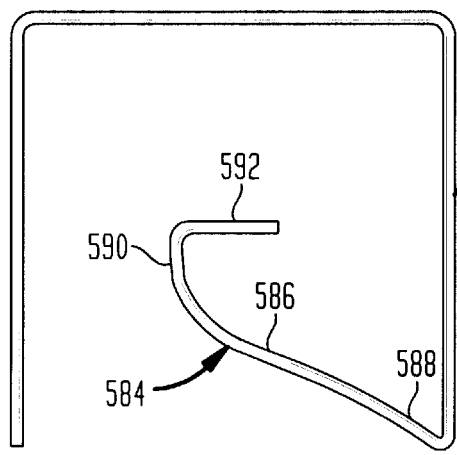
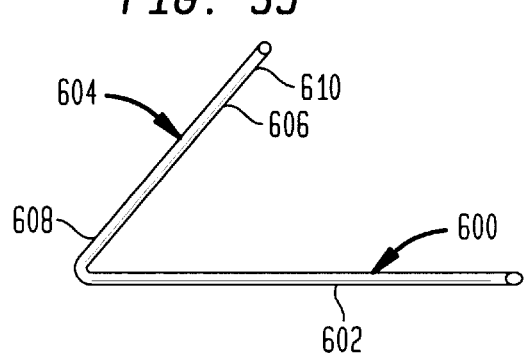
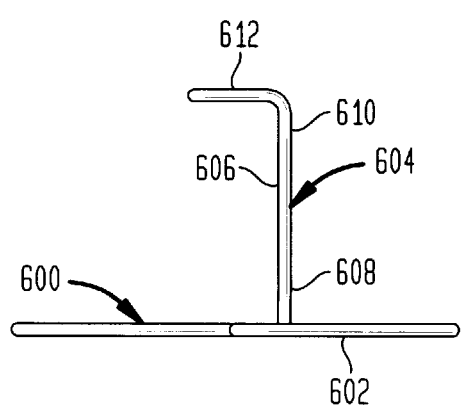
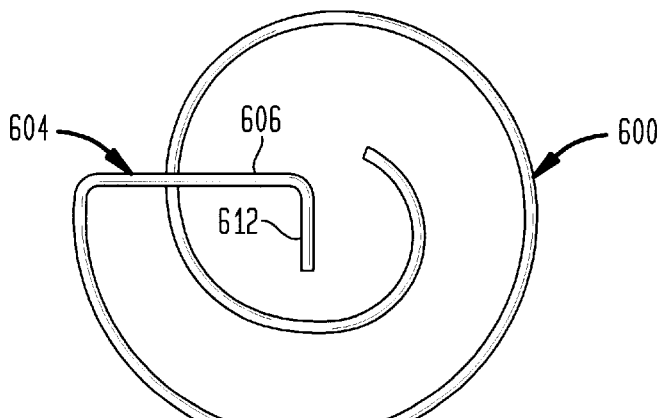

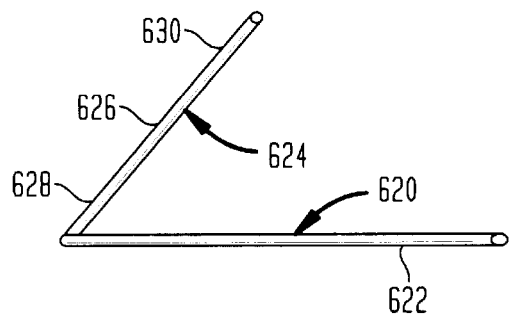
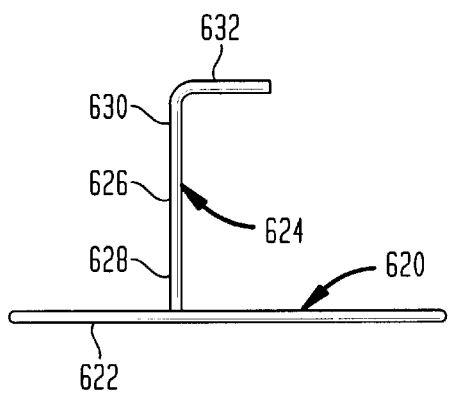
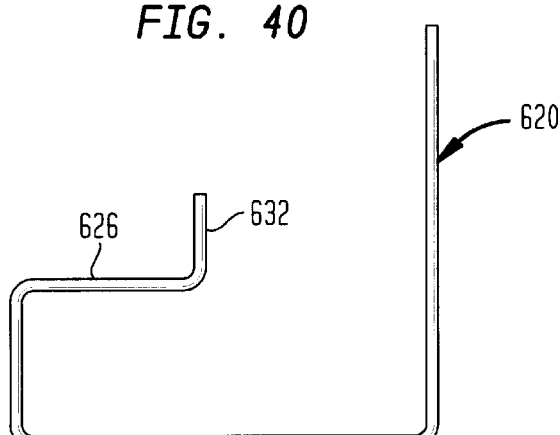
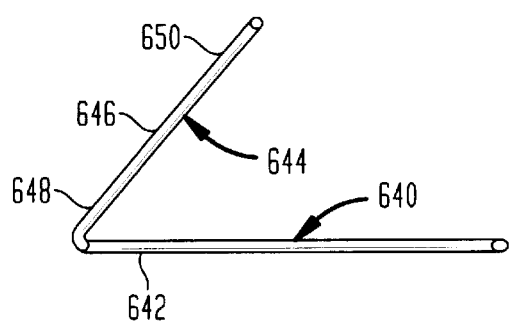
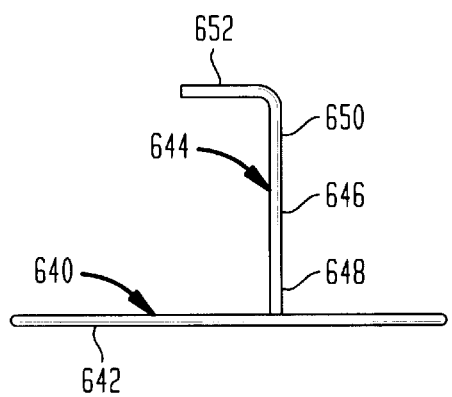
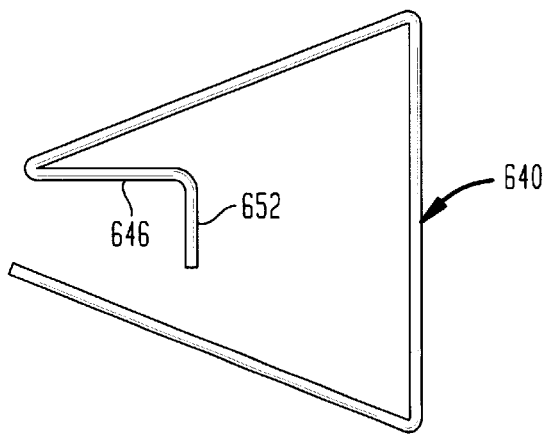

INDOOR MOUNTING ARRANGEMENT FOR WIRELESS SYSTEMS

CROSS REFERENCES TO RELATED APPLICATIONS

This application is a continuation in part of application Ser. No. 09/118,239, filed on Jul. 17, 1998, and titled Improved Mounting Bracket With Integral Heat Sink Capabilities.

FIELD OF THE INVENTION

This invention relates to the field of brackets, and more particularly to an indoor mounting bracket for wireless systems.

BACKGROUND OF THE INVENTION

Certain types of electronic instruments are typically mounted on a building or pole or wall, and must be pointed in a given direction to function. With PCS and other wireless communication systems, antennas are aligned to provide coverage in predetermined sectors. In many cases, a transmitter, receiver, or amplifier is mounted along with the antenna. The portability of digital equipment continues to grow and be utilized in increasingly more applications.

Accordingly, there is a need to provide a mounting bracket for an integrated antenna and radio system which provides reasonable mobility while permitting stable alignment.

SUMMARY OF THE INVENTION

In accordance with the present invention, there is provided a bracket for mounting an electronic instrument upon a generally horizontal surface. The bracket comprises a base member having an outer surface and an opposite mounting surface for mounting the base member on the horizontal surface. The bracket also comprises a support member having an outer surface and an opposite mounting surface for mounting the support member on the electronic instrument. The bracket further comprises an intermediate member extending between the base member and the support member. The intermediate member is pivotally attached to the support member.

BRIEF DESCRIPTION OF THE DRAWING

A more complete understanding of the present invention may be obtained from consideration of the following description in conjunction with the drawings, in which:

FIG. 32 is a front elevational view of a further mounting bracket, showing the base and intermediate members only;

FIG. 33 is a right side elevational view of the mounting bracket of FIG. 32;

FIG. 34 is a top plan view of the mounting bracket of FIG. 32;

FIG. 35 is a front elevational view of a further mounting bracket, showing the base and intermediate members only;

FIG. 36 is a right side elevational view of the mounting bracket of FIG. 35;

FIG. 37 is a top plan view of the mounting bracket of FIG. 35;

FIG. 38 is a front elevational view of a further mounting bracket, showing the base and intermediate members only;

FIG. 39 is a right side elevational view of the mounting bracket of FIG. 38;

FIG. 40 is a top plan view of the mounting bracket of FIG. 38;

FIG. 41 is a front elevational view of a further mounting bracket, showing the base and intermediate members only;

FIG. 42 is a right side elevational view of the mounting bracket of FIG. 41; and, FIG. 43 is a top plan view of the mounting bracket of FIG. 41.

DESCRIPTION OF THE PREFERRED EMBODIMENTS

Figure 1:
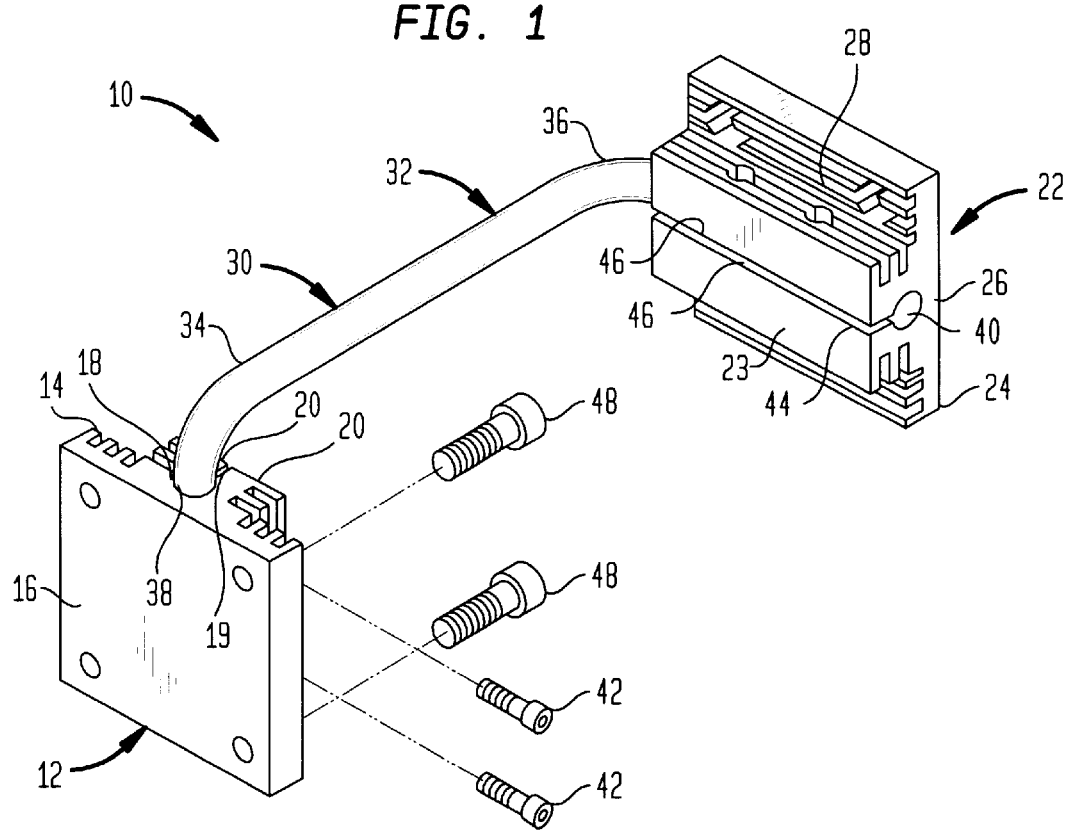
FIG. 1 is a perspective view of a mounting bracket with integral heat sink.
Figure 4:
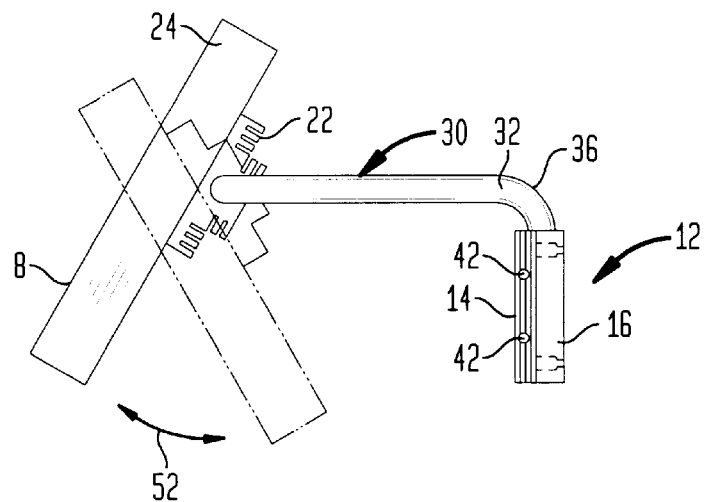
FIG. 4 is a side elevational view of the mounting bracket of FIG. 1, showing the instrument mounted for use.
Figure 5:
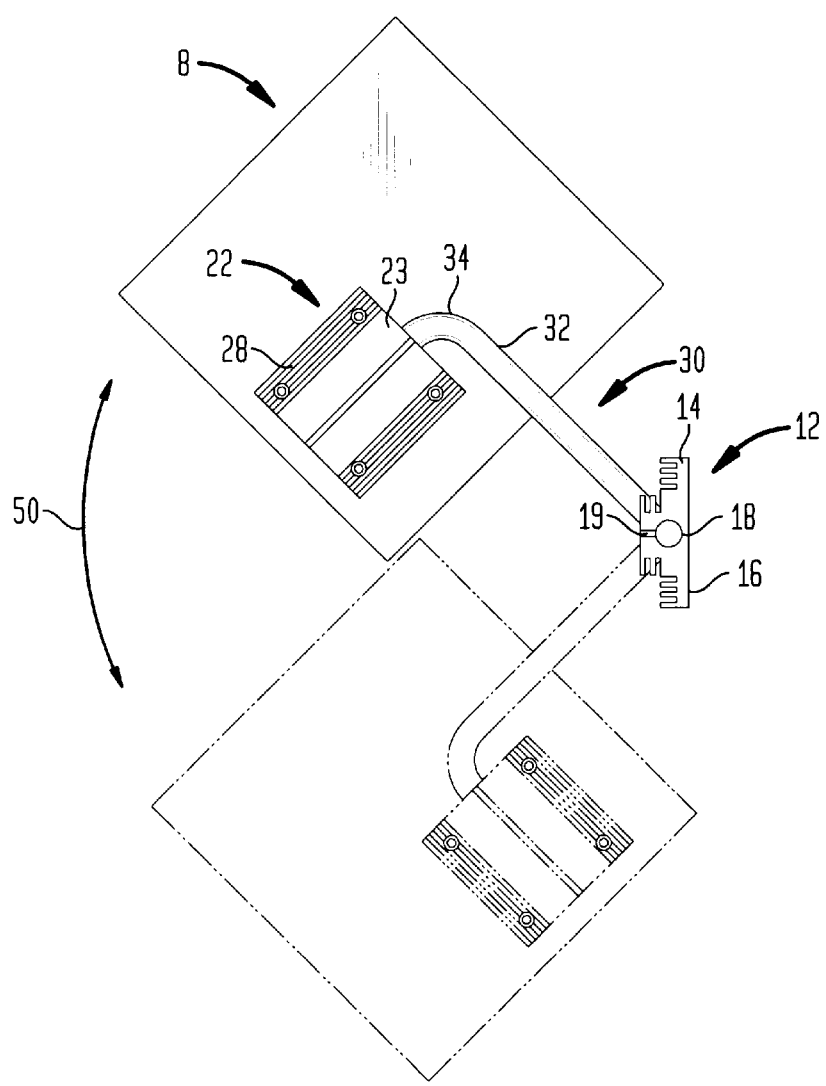
FIG. 5 is a bottom plan view of the mounting bracket of FIG. 4.
Figure 6:
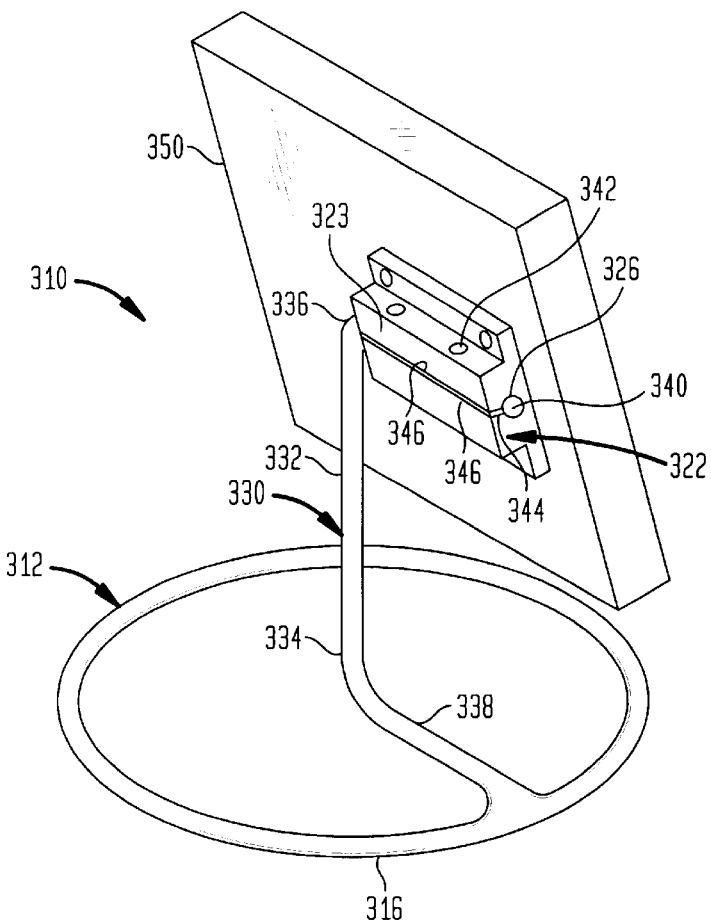
FIG. 6 is a perspective view of still another mounting bracket constructed in accordance with the invention, showing the instrument mounted for use.
Figure 7:
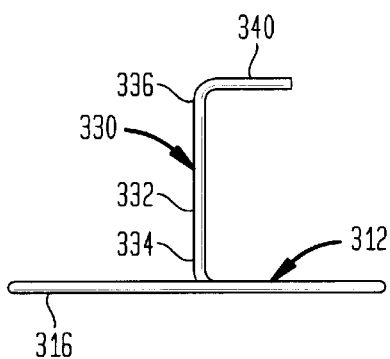
FIG. 7 is a front elevational view of the mounting bracket of FIG. 6, showing the base and intermediate members only.
Figure 8:
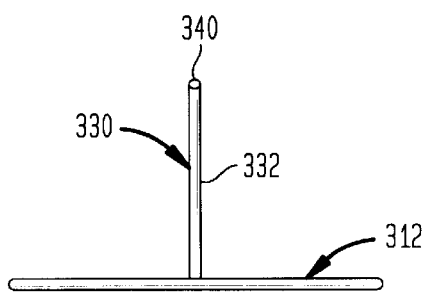
FIG. 8 is a right side elevational view of the mounting bracket of FIG. 7.
Figure 9:
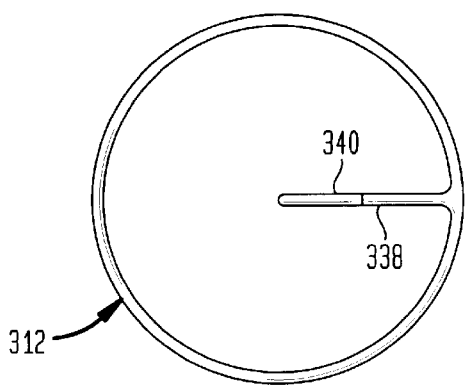
FIG. 9 is a top plan view of the mounting bracket of FIG. 7.
Figure 10:
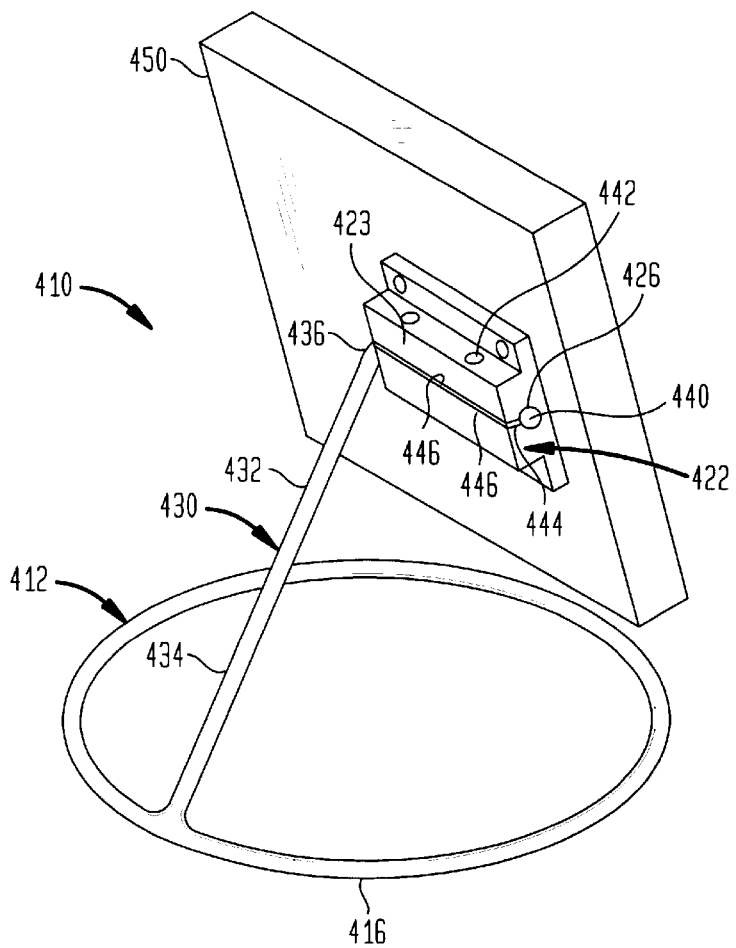
FIG. 10 is a perspective view of yet another mounting bracket constructed in accordance with the invention, showing the instrument mounted for use.
Figure 11:
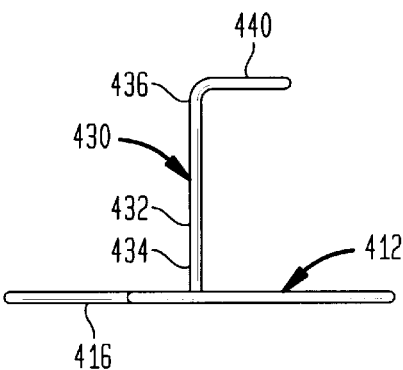
FIG. 11 is a front elevational view of the mounting bracket of FIG. 10, showing the base and intermediate members only.
Figure 12:
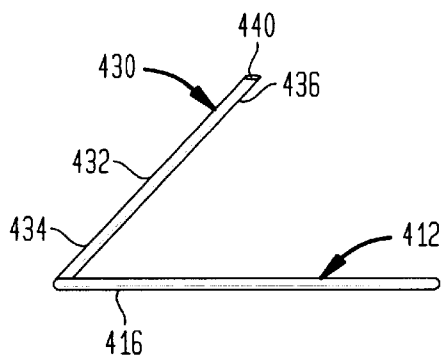
FIG. 12 is a right side elevational view of the mounting bracket of FIG. 11.
Figure 13:
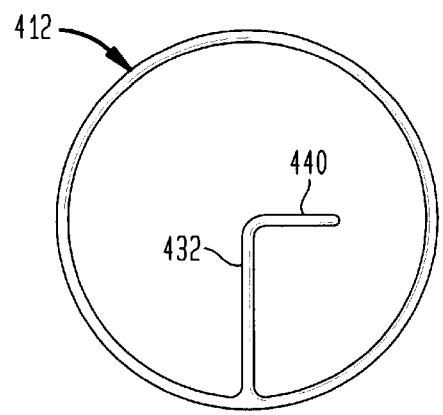
FIG. 13 is a top plan view of the mounting bracket of FIG. 11.

Referring now to the drawings, and especially to FIGS. 1, 4, and 5, a bracket is shown at 10 for mounting an electronic instrument 8, such as an integrated antenna and radio system as described in pending U.S. patent application Ser. No. 09/119,438 entitled "Integrated Radio and Directional Antenna System" filed on Jul. 20, 1998, which is herein incorporated by reference. The bracket 10 comprises a base member 12 having an outer surface 14 and an opposite mounting surface 16 for mounting the base member 12 upon a foundation (not shown), such as a building, pole or wall. The base member 12 includes a base pivot hole 18, and a base slot 19 generally parallel to the base pivot hole 18. The base slot 19 communicates with the base pivot hole 18 and extends to the base member outer surface 14. The base slot 19 has opposite sides 20. Base mounting screws 48 fasten the base member to the foundation.

The bracket 10 also comprises a support member 22 having an outer surface 23 and an opposite mounting surface 24 for mounting the support member 22 on the instrument 8. The support member 22 is attached to the instrument 8 proximal to a heat producing source associated within instrument 8, in order to optimize thermal transfer from the heat producing source through the instrument 8 to the bracket 10. The support member 22 includes a support pivot hole 26, and a support slot 44, generally parallel to the support pivot hole 26. The support slot 44 communicates with the support pivot hole 26 and extends to the support member outer surface 23. The support slot 44 has opposite sides 46. The support member 22 further includes a plurality of fins 28 arrayed on the outer surface 23, forming a heat sink unitary with the support member 22 for dissipating heat from the instrument 8. The base member 12, as an option, could be made with identical fins and dimensions, to simplify production, warehousing, and shipping.

The bracket 10 further comprises an intermediate member 30 extending between the base member 12 and the support member 22. The intermediate member 30 is thermally connected to the support member 22 providing an additional element for dissipating heat into the environment as well as to base member 12. The intermediate member 30 includes an elongated element 32 extending between opposite first 34 and second 36 ends. The intermediate member 30 has a first arm 38 extending generally perpendicularly from the elongated element first end 34. The first arm 38 and the elongated element 32 lie within a first plane. The first arm 38 pivotally engages the base pivot hole 18. The intermediate member 30 has a second arm 40 extending generally perpendicularly from the elongated element second end 36. The second arm 40 and the elongated element 32 lie within a second plane generally perpendicular to the first plane. The second arm 40 pivotally engages the support pivot hole 26.

A first clamping means is provided for releasably clamping the first arm 38 in the base pivot hole 18. This allows adjustment of a base angle of the elongated element 32 with respect to the base member 12 and selective locking of the base angle, which is azimuth, shown by arrow 50 in FIG. 5. The first clamping means includes at least one, and preferably two, clamping screws 42 disposed transversely to the base slot 19 and threadingly engaging the base member 12. Thus, as the clamping screws 42 are advanced, the opposite sides 20 of the base slot 19 will be drawn together, thereby clamping the first arm 38 in the base pivot hole 18.

A second clamping means is provided for releasably clamping the second arm 40 in the support pivot hole 26. This allows adjustment of a support angle of the support member 22 with respect to the elongated element 30 and selective locking of the support angle, which is elevation, shown by arrow 52 in FIG. 4. The second clamping means includes at least one, and preferably two, clamping screws 42 (not shown) disposed transversely to the support slot 44 and threadingly engaging the support member 22, so that as the clamping screws 42 are advanced, opposite sides 46 of the support slot 44 will be drawn together, thereby clamping the second arm 40 in the support pivot hole 26.

Figure 2:
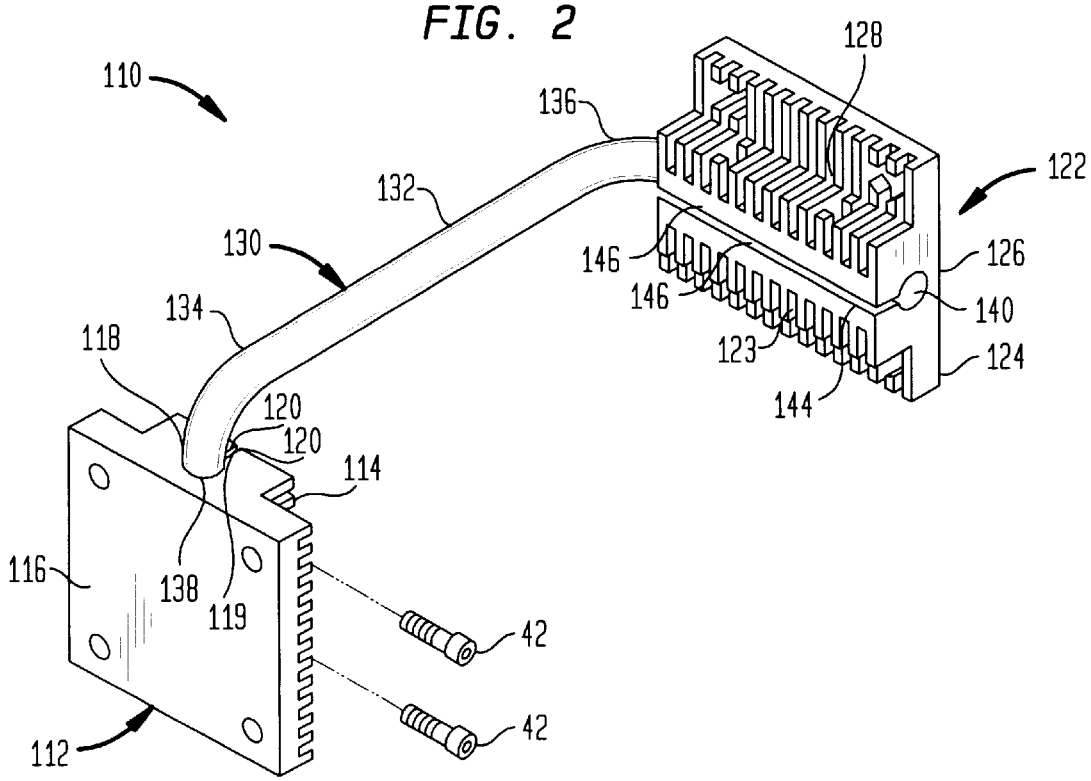
FIG. 2 is a perspective view of another mounting bracket with integral heat sink.

Turning now to FIG. 2, another embodiment of the bracket is shown at 110. This embodiment is similar to bracket 10, except that the heat sink fins are arrayed in a different direction. Bracket 110 comprises a base member 112 having an outer surface 114 and an opposite mounting surface 116 for mounting the base member 112 on the foundation. The base member 112 includes a base pivot hole 118, and a base slot 119 generally parallel to the base pivot hole 118. The base slot 119 communicates with the base pivot hole 118 and extends to the base member outer surface 114. The base slot 119 has opposite sides 120.

The bracket 110 also comprises a support member 122 having an outer surface 123 and an opposite mounting surface 124 for mounting the support member 122 on the instrument. The support member 122 includes a support pivot hole 126, and a support slot 144, generally parallel to the support pivot hole 126. The support slot 144 communicates with the support pivot hole 126 and extends to the support member outer surface 123. The support slot 144 has opposite sides 146. The support member 122 further includes a plurality of fins 128 arrayed on the outer surface 123, forming a heat sink unitary with the support member 122 for dissipating heat from the instrument. The base member 112, as an option, could be made with identical fins and dimensions, to simplify production, warehousing, and shipping.

The bracket 110 further comprises an intermediate member 130 extending between the base member 112 and the support member 122. The intermediate member 130 includes an elongated element 132 extending between opposite first 134 and second 136 ends. The intermediate member 130 has a first arm 138 extending generally perpendicularly from the elongated element first end 134. The first arm 138 and the elongated element 132 lie within a first plane. The first arm 138 pivotally engages the base pivot hole 118. The intermediate member 130 has a second arm 140 extending generally perpendicularly from the elongated element second end 136. The second arm 140 and the elongated element 132 lie within a second plane generally perpendicular to the first plane. The second arm 140 pivotally engages the support pivot hole 126.

A first clamping means is provided for releasably clamping the first arm 138 in the base pivot hole 118. This allows adjustment of a base angle of the elongated element 132 with respect to the base member 112 and selective locking of the base angle. The first clamping means includes at least one, and preferably two, clamping screws 142 disposed transversely to the base slot 119 and threadingly engaging the base member 112. Thus, as the clamping screws 142 are advanced, the opposite sides 120 of the base slot 119 will be drawn together, thereby clamping the first arm 138 in the base pivot hole 118.

A second clamping means is provided for releasably clamping the second arm 140 in the support pivot hole 126. This allows adjustment of a support angle of the support member 122 with respect to the elongated element 130 and selective locking of the support angle. The second clamping means includes at least one, and preferably two, clamping screws 142 disposed transversely to the support slot 144 and threadingly engaging the support member 122, so that as the clamping screws 142 are advanced, opposite sides 146 of the support slot 144 will be drawn together, thereby clamping the second arm 140 in the support pivot hole 126.

Figure 3:
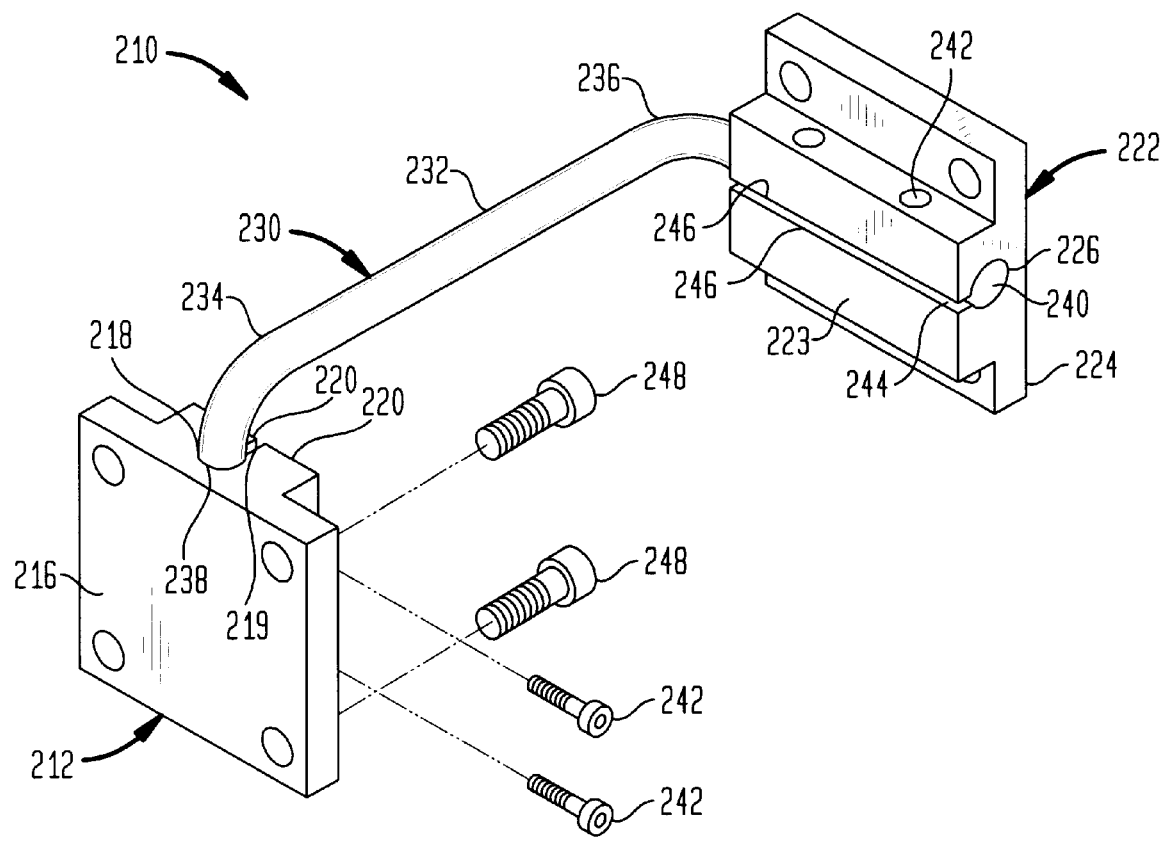
FIG. 3 is a perspective view of yet another mounting bracket with integral heat sink.

Referring now to FIG. 3, yet another embodiment of the bracket is shown at 210. This embodiment is also similar to bracket 10, except that it has no heat sink fins. The bracket 210 comprises a base member 212 having an outer surface 214 and an opposite mounting surface 216 for mounting the base member 212 on the foundation. The base member 212 includes a base pivot hole 218, and a base slot 219 generally parallel to the base pivot hole 218. The base slot 219 communicates with the base pivot hole 218 and extends to the base member outer surface 214. The base slot 219 has opposite sides 220.

The bracket 210 also comprises a support member 222 having an outer surface 223 and an opposite mounting surface 224 for mounting the support member 222 on the instrument. The support member 222 includes a support pivot hole 226, and a support slot 244, generally parallel to the support pivot hole 226. The support slot 244 communicates with the support pivot hole 226 and extends to the support member outer surface 223. The support slot 244 has opposite sides 246.

The bracket 210 further comprises an intermediate member 230 extending between the base member 212 and the support member 222. The intermediate member 230 includes an elongated element 232 extending between opposite first 234 and second 236 ends. The intermediate member 230 has a first arm 238 extending generally perpendicularly from the elongated element first end 234. The first arm 238 and the elongated element 232 lie within a first plane. The first arm 238 pivotally engages the base pivot hole 218. The intermediate member 230 has a second arm 240 extending generally perpendicularly from the elongated element second end 236. The second arm 240 and the elongated element 232 lie within a second plane generally perpendicular to the first plane. The second arm 240 pivotally engages the support pivot hole 226.

A first clamping means is provided for releasably clamping the first arm 238 in the base pivot hole 218. This allows adjustment of a base angle of the elongated element 232 with respect to the base member 212 and selective locking of the base angle. The first clamping means includes at least one, and preferably two, clamping screws 242 disposed transversely to the base slot 219 and threadingly engaging the base member 212. Thus, as the clamping screws 242 are advanced, the opposite sides 220 of the base slot 219 will be drawn together, thereby clamping the first arm 238 in the base pivot hole 218.

A second clamping means is provided for releasably clamping the second arm 240 in the support pivot hole 226. This allows adjustment of a support angle of the support member 222 with respect to the elongated element 230 and selective locking of the support angle. The second clamping means includes at least one, and preferably two, clamping screws 242 disposed transversely to the support slot 244 and threadingly engaging the support member 222, so that as the clamping screws 242 are advanced, opposite sides 246 of the support slot 244 will be drawn together, thereby clamping the second arm 240 in the support pivot hole 226.

Referring to FIGS. 6, 7, 8, and 9, an embodiment of the invention is shown at 310. This embodiment differs from brackets 10, 110, and 210, in that the base member 312 is ring-shaped. Base member 312 has a mounting surface 316 for mounting the base member 312 upon a generally horizontal surface (foundation). Illustratively, the generally horizontal surface on which base member 312 is mounted may be a table, desk, shelf or on the floor. The base member 312 will then be slidingly rotated on the generally horizontal surface to adjust the base angle, which is azimuth.

The bracket 310 also comprises a support member 322 having an outer surface 323 and an opposite mounting surface 324 for mounting the support member 322 on an instrument 350. For the preferred embodiment, the instrument 350 is mounted on the bracket 310 adjacent the center of gravity of the instrument 350, so as to approximately balance the instrument 350 on the bracket 310. The support member 322 includes a support pivot hole 326, and a support slot 344, generally parallel to the support pivot hole 326. The support slot 344 communicates with the support pivot hole 326 and extends to the support member outer surface 323. The support slot 344 has opposite sides 346. As an option, the support member 322 may include a plurality of fins (not shown) arrayed on the outer surface 323, in a manner similar to that of brackets 10 and 110. The fins would form a heat sink unitary with the support member 322 for dissipating heat from the instrument.

The bracket 310 further comprises an intermediate member 330 projecting upward from within the base member 312, and extending between the base member 312 and the support member 322. The intermediate member 330 includes an elongated element 332 extending between opposite first 334 and second 336 ends. The intermediate member 330 has a first arm 338 extending generally perpendicularly from the elongated element first end 334, and extending between the elongated element first end 334 and the base member 312. The intermediate member 330 has a second arm 340 extending generally perpendicularly from the elongated element second end 336. The second arm 340 pivotally engages the support pivot hole 326.

A clamping means is provided for releasably clamping the second arm 340 in the support pivot hole 326. This allows adjustment of a support angle of the support member 322 with respect to the elongated element 330 and selective locking of the support angle, which is elevation. The clamping means includes at least one, and preferably two, clamping screws 342 disposed transversely to the support slot 344 and threadingly engaging the support member 322, so that as the clamping screws 342 are advanced, opposite sides 346 of the support slot 344 will be drawn together, thereby clamping the second arm 340 in the support pivot hole 326.

Referring to FIGS. 10, 11, 12, and 13, still another embodiment of the invention is shown at 410. This embodiment differs from brackets 10, 110, and 210, and is similar to bracket 310, in that the base member 412 is ring-shaped. Base member 412 has a mounting surface 416 for mounting the base member 412 upon a generally horizontal surface.

Illustratively, the generally horizontal surface on which base member 412 is mounted may be a table, desk, shelf or on the floor. The base member 412 will then be slidingly rotated on the generally horizontal surface to adjust the base angle, which is azimuth.

The bracket 410 also comprises a support member 422 having an outer surface 423 and an opposite mounting surface 424 for mounting the support member 422 on the instrument 450. For a preferred embodiment, the instrument 450 is mounted on the bracket 410 adjacent the center of gravity of the instrument 450, so as to balance the instrument 450 on the bracket 410. The support member 422 includes a support pivot hole 426, and a support slot 444, generally parallel to the support pivot hole 426. The support slot 444 communicates with the support pivot hole 426 and extends to the support member outer surface 423. The support slot 444 has opposite sides 446. As an option, the support member 422 may include a plurality of fins (not shown) arrayed on the outer surface 423, in a manner similar to that of brackets 10 and 110. The fins would form a heat sink unitary with the support member 422 for dissipating heat from the instrument.

The bracket 410 further comprises an intermediate member 430 projecting upward from within the base member 412, and extending at an angle between the base member 412 and the support member 422. The intermediate member 430 includes an elongated element 432 extending between opposite first 434 and second 436 ends. The elongated element first end 434 is attached directly to the base member 412. The intermediate member 430 has a second arm 440 extending generally perpendicularly from the elongated element second end 436. The second arm 440 pivotally engages the support pivot hole 426.

A clamping means is provided for releasably clamping the second arm 440 in the support pivot hole 426. This allows adjustment of a support angle of the support member 422 with respect to the elongated element 430 and selective locking of the support angle, which is elevation. The clamping means includes at least one, and preferably two, clamping screws 442 disposed transversely to the support slot 444 and threadingly engaging the support member 422, so that as the clamping screws 442 are advanced, opposite sides 446 of the support slot 444 will be drawn together, thereby clamping the second arm 440 in the support pivot hole 426.

Referring now to FIGS. 14 through 43, further embodiments of the base member and intermediate member of the invention are shown. In each embodiment, the support member and other features and functions are similar to those described above, and so are not shown.

Figure 14:
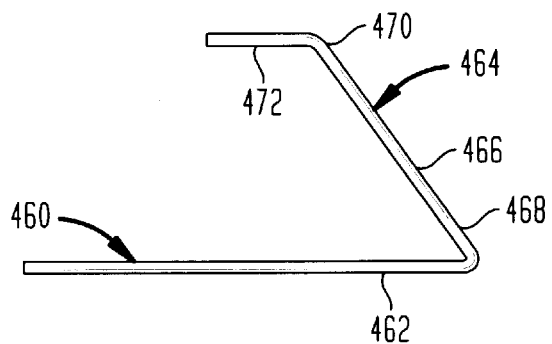
FIG. 14 is a front elevational view of a further mounting bracket, showing the base and intermediate members only.
Figure 15:
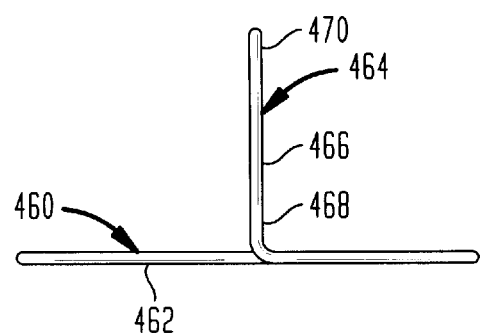
FIG. 15 is a right side elevational view of the mounting bracket of FIG. 14.
Figure 16:
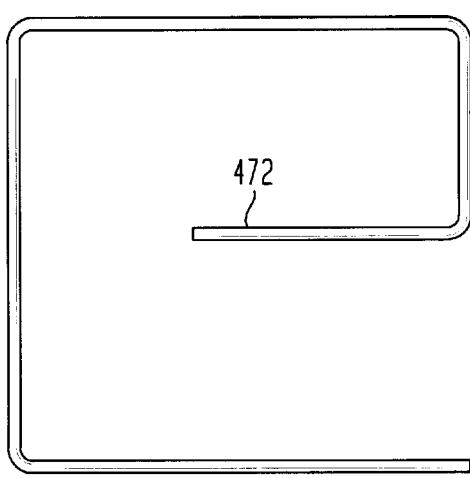
FIG. 16 is a top plan view of the mounting bracket of FIG. 14.

FIGS. 14, 15, and 16 show a base member at 460 having a mounting surface 462. An intermediate member 464 includes an elongated element 466 with a first end 468 and a second end 470. A second arm 472 extends from the second end 470. The elongated element first end 468 is attached directly to the base member 460.

Figure 17:
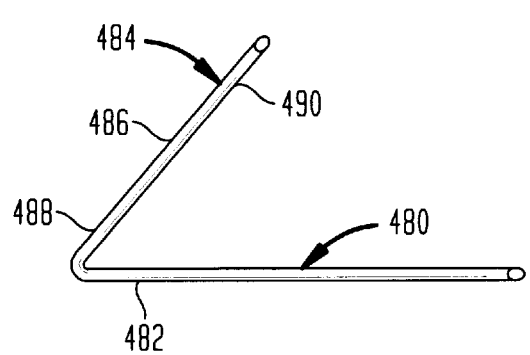
FIG. 17 is a front elevational view of a further mounting bracket, showing the base and intermediate members only.
Figure 18:
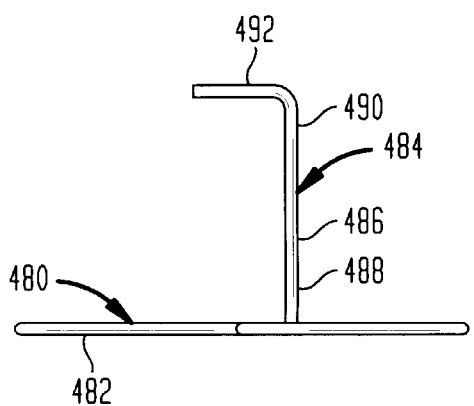
FIG. 18 is a right side elevational view of the mounting bracket of FIG. 17.
Figure 19:
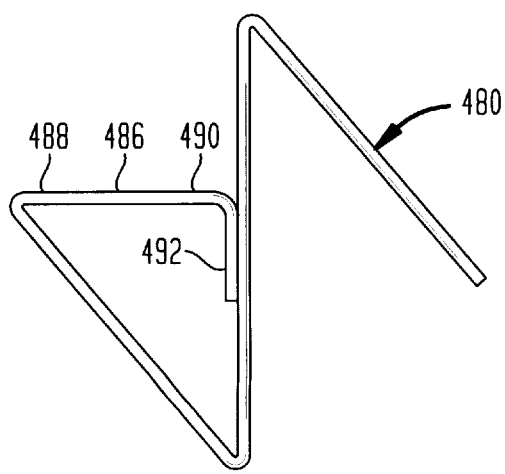
FIG. 19 is a top plan view of the mounting bracket of FIG. 17.

FIGS. 17, 18, and 19 show a base member at 480 having a mounting surface 482. An intermediate member 484 includes an elongated element 486 with a first end 488 and a second end 490. A second arm 492 extends from the second end 490. The elongated element first end 488 is attached directly to the base member 480.

Figure 20:
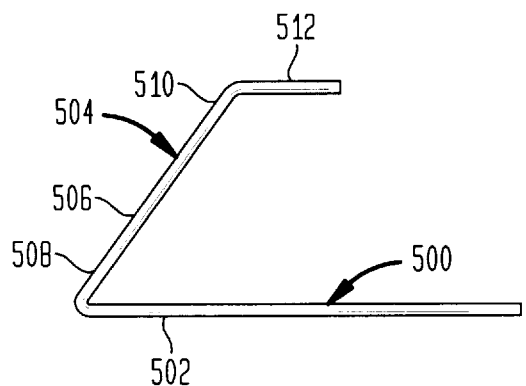
FIG. 20 is a front elevational view of a further mounting bracket, showing the base and intermediate members only.
Figure 21:
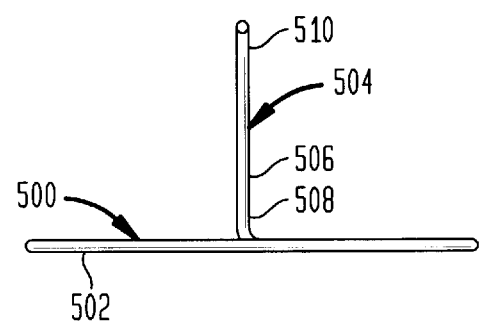
FIG. 21 is a right side elevational view of the mounting bracket of FIG. 20.
Figure 22:
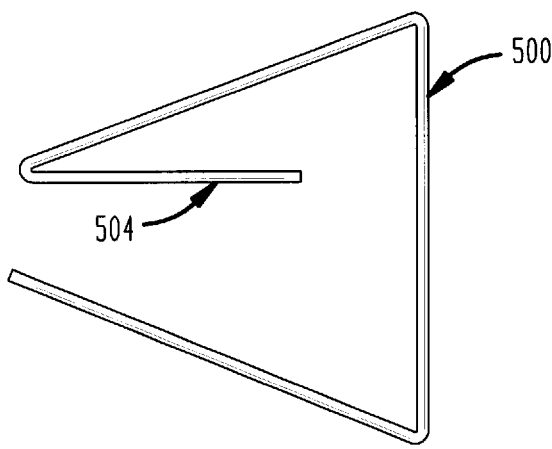
FIG. 22 is a top plan view of the mounting bracket of FIG. 20.

FIGS. 20, 21, and 22 show a base member at 500 having a mounting surface 502. An intermediate member 504 includes an elongated element 506 with a first end 508 and a second end 510. A second arm 512 extends from the second end 510. The elongated element first end 508 is attached directly to the base member 500.

Figure 23:
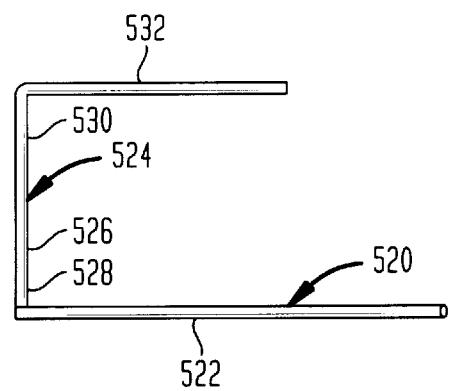
FIG. 23 is a front elevational view of a further mounting bracket, showing the base and intermediate members only.
Figure 24:
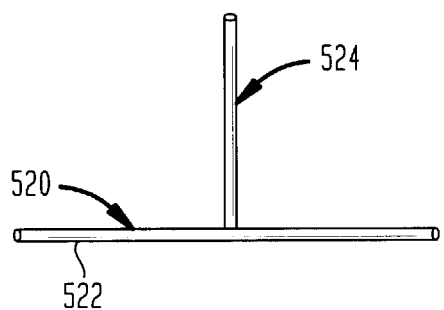
FIG. 24 is a right side elevational view of the mounting bracket of FIG. 23.
Figure 25:
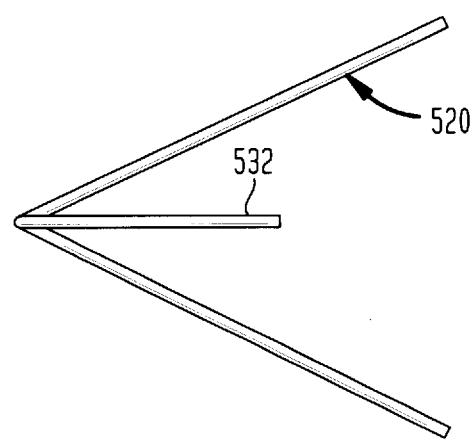
FIG. 25 is a top plan view of the mounting bracket of FIG. 23.

FIGS. 23, 24, and 25 show a base member at 520 having a mounting surface 522. An intermediate member 524 includes an elongated element 526 with a first end 528 and a second end 530. A second arm 532 extends from the second end 530. The elongated element first end 528 is attached directly to the base member 520.

Figure 26:
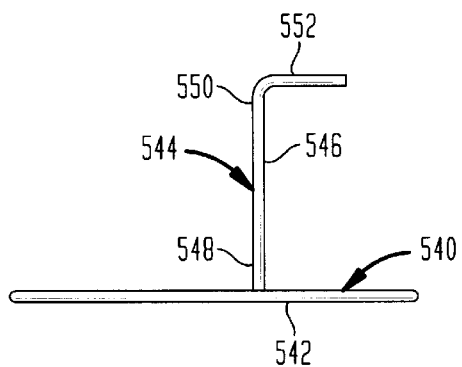
FIG. 26 is a front elevational view of a further mounting bracket, showing the base and intermediate members only.
Figure 27:
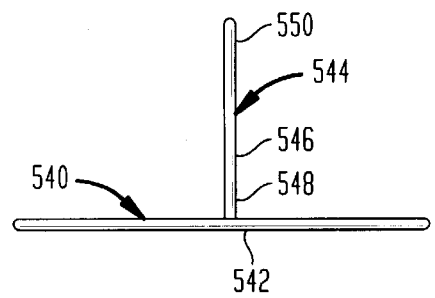
FIG. 27 is a right side elevational view of the mounting bracket of FIG. 26.
Figure 28:
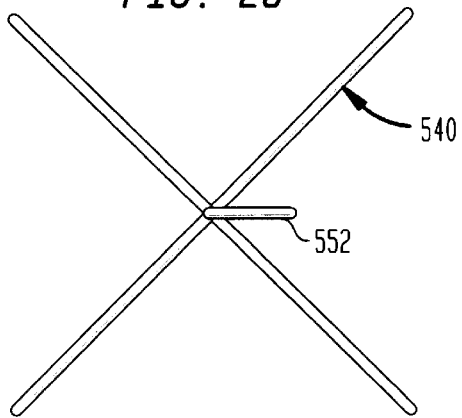
FIG. 28 is a top plan view of the mounting bracket of FIG. 26.

FIGS. 26, 27, and 28 show a base member at 540 having a mounting surface 542. An intermediate member 544 includes an elongated element 546 with a first end 548 and a second end 550. A second arm 552 extends from the second end 550. The elongated element first end 548 is attached directly to the base member 540.

Figure 29:
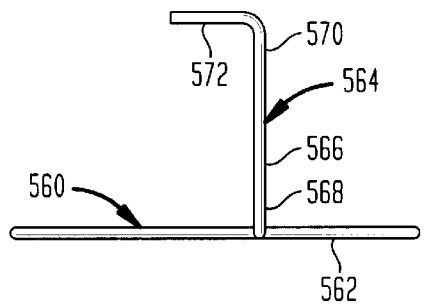
FIG. 29 is a front elevational view of a further mounting bracket, showing the base and intermediate members only.
Figure 30:
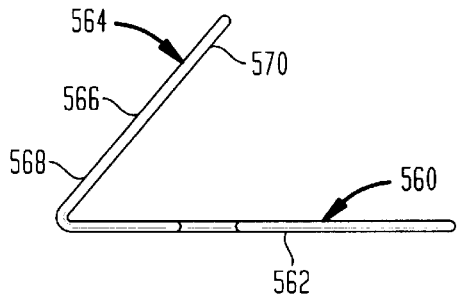
FIG. 30 is a right side elevational view of the mounting bracket of FIG. 29.
Figure 31:
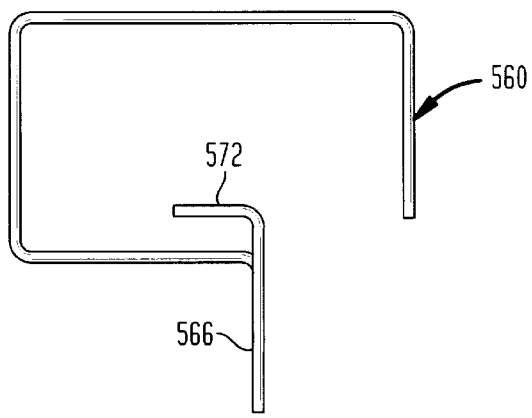
FIG. 31 is a top plan view of the mounting bracket of FIG. 29.

FIGS. 29, 30, and 31 show a base member at 560 having a mounting surface 562. An intermediate member 564 includes an elongated element 566 with a first end 568 and a second end 570. A second arm 572 extends from the second end 570. The elongated element first end 568 is attached directly to the base member 560.

FIGS. 32, 33, and 34 show a base member at 580 having a mounting surface 582. An intermediate member 584 includes an elongated element 586 with a first end 588 and a second end 590. A second arm 592 extends from the second end 590. The elongated element first end 588 is attached directly to the base member 580.

FIGS. 35, 36, and 37 show a base member at 600 having a mounting surface 602. An intermediate member 604 includes an elongated element 606 with a first end 608 and a second end 610. A second arm 612 extends from the second end 610. The elongated element first end 608 is attached directly to the base member 600.

FIGS. 38, 39, and 40 show a base member at 620 having a mounting surface 622. An intermediate member 624 includes an elongated element 626 with a first end 628 and a second end 630. A second arm 632 extends from the second end 630. The elongated element first end 628 is attached directly to the base member 620.

FIGS. 41, 42, and 43 show a base member at 640 having a mounting surface 642. An intermediate member 644 includes an elongated element 646 with a first end 648 and a second end 650. A second arm 652 extends from the second end 650. The elongated element first end 648 is attached directly to the base member 640.

The present invention is well suited for use in an integrated radio and directional antenna system for providing a portable direct connection to a digital network.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. While the present invention is described with a variety of particular configurations for the mounting bracket, different mounting brackets may be utilized. For example, the mounting brackets may include integrated heat sinks. Additionally, the mounting bracket may be a pole or rod which is inserted into the substantially horizontal surface. Details of the structure may be varied substantially without departing from the spirit of the invention and the exclusive use of all modifications which will come within the scope of the appended claims is reserved.

What is claimed:

1. A bracket for mounting an instrument upon a generally horizontal surface, the bracket comprising:
   a base member;
   a support member having an outer surface and an opposite mounting surface for mounting the support member on the instrument;

an intermediate member extending between the base member and the support member; and pivotal means for pivotal attachment of the intermediate member to the support member;

wherein the instrument is mounted for pivotal movement in a generally horizontal plane for adjustment of a base angle, and for pivotal movement in a generally vertical plane for adjustment of a support angle.

2. The bracket as recited in claim 1, wherein:

the intermediate member includes an elongated element extending between opposite first and second ends, the intermediate member having a second arm extending from the elongated element second end;

the support member includes a support pivot hole;

the pivotal means includes pivotal engagement of the second arm in the support pivot hole; and the bracket further comprises clamping means for releasably clamping the second arm in the support pivot hole so as to allow adjustment of the support angle of the support member with respect to the elongated element and selective locking of the support angle.

3. The bracket as recited in claim 2, wherein:

the support member includes a support slot generally parallel to the support pivot hole, the support slot communicating with the support pivot hole and extending to the support member outer surface;

the clamping means includes at least one clamping screw disposed transversely to the support slot and threadingly engaging the support member, so that as the clamping screw is advanced, opposite sides of the support slot will be drawn together, thereby clamping the second arm in the support pivot hole; and the instrument is mounted on the bracket adjacent the center of gravity of the instrument, so as to balance the instrument on the bracket.

4. The bracket as recited in claim 3, wherein:

the base member is ring-shaped;

the intermediate member projects upward from within the base member; and a first arm extends between the elongated element first end and the base member; so that upon mounting the instrument on the bracket the base member will be mounted upon a generally horizontal surface, and the base member will be slidingly rotated on the generally horizontal surface to adjust the base angle.

5. The bracket as recited in claim 1, wherein:

the support member includes a unitary heat sink having a plurality of fins arrayed on the outer surface of the support member for dissipating heat from the instrument.

6. The bracket as recited in claim 3, wherein:

the base member is ring-shaped;

the intermediate member projects upward from within the base member; and the elongated element first end is connected to the base member; so that upon mounting the instrument on the bracket the base member will be mounted upon a generally horizontal surface, and the base member will be slidingly rotated on the generally horizontal surface to adjust the base angle.

7. A bracket for mounting an instrument upon a generally horizontal surface, the bracket comprising:

a base member having an outer surface and an opposite mounting surface for mounting the base member on the generally horizontal surface;

a support member having an outer surface and an opposite mounting surface for mounting the support member on the instrument, the support member having a unitary heat sink for dissipating heat from the instrument; and, an intermediate member extending between the base member and the support member;

wherein the intermediate member is pivotally attached to the base member and the intermediate member is pivotally attached to the support member.

8. A bracket for mounting an instrument upon a generally horizontal surface, the bracket comprising:

a base member having an outer surface and an opposite mounting surface for mounting the base member on the generally horizontal surface;

a support member having an outer surface and an opposite mounting surface for mounting the support member on the instrument;

an intermediate member extending between the base member and the support member;

first pivotal means for pivotal attachment of the intermediate member to the base member; and second pivotal means for pivotal attachment of the intermediate member to the support member.

9. The bracket as recited in claim 8, wherein:

the intermediate member includes an elongated element extending between opposite first and second ends, the intermediate member having a first arm extending generally perpendicularly from the elongated element first end, the first arm and the elongated element lying within a first plane, the intermediate member having a second arm extending generally perpendicularly from the elongated element second end, the second arm and the elongated element lying within a second plane generally perpendicular to the first plane;

the base member includes a base pivot hole;

the first pivotal means includes pivotal engagement of the first arm in the base pivot hole;

the bracket further comprises first clamping means for releasably clamping the first arm in the base pivot hole so as to allow adjustment of a base angle of the elongated element with respect to the base member and selective locking of the base angle;

the support member includes a support pivot hole;

the second pivotal means includes pivotal engagement of the second arm in the support pivot hole; and the bracket further comprises second clamping means for releasably clamping the second arm in the support pivot hole so as to allow adjustment of a support angle of the support member with respect to the elongated element and selective locking of the support angle.

10. The bracket as recited in claim 9, wherein:

the base member includes a base slot generally parallel to the base pivot hole, the base slot communicating with the base pivot hole and extending to the base member outer surface;

the first clamping means includes at least one clamping screw disposed transversely to the base slot and threadingly engaging the base member, so that as the clamping screw is advanced, opposite sides of the base slot will be drawn together, thereby clamping the first arm in the base pivot hole;

the support member includes a support slot generally parallel to the support pivot hole, the support slot communicating with the support pivot hole and extending to the support member outer surface;

the second clamping means includes at least one clamping screw disposed transversely to the support slot and threadingly engaging the support member, so that as the clamping screw is advanced, opposite sides of the support slot will be drawn together, thereby clamping the second arm in the support pivot hole; and the support member includes a unitary heat sink having a plurality of fins arrayed on the outer surface of the support member for dissipating heat from the instrument.

11. A bracket for mounting a wireless modem upon a generally horizontal surface, the bracket comprising:

a base member having an outer surface and an opposite mounting surface for mounting the base member on the generally horizontal surface, the base member including a base pivot hole;

a support member having an outer surface and an opposite mounting surface for mounting the support member on the instrument, the support member including a support pivot hole, the support member including a plurality of fins arrayed on the outer surface forming a heat sink unitary with the support member for dissipating heat from the instrument;

an intermediate member extending between the base member and the support member, the intermediate member including an elongated element extending between opposite first and second ends, the intermediate member having a first arm extending generally perpendicularly from the elongated element first end, the first arm and the elongated element lying within a first plane, the first arm pivotally engaging the base pivot hole, the intermediate member having a second arm extending generally perpendicularly from the elongated element second end, the second arm and the elongated element lying within a second plane generally perpendicular to the first plane, the second arm pivotally engaging the support pivot hole;

first clamping means for releasably clamping the first arm in the base pivot hole so as to allow adjustment of a base angle of the elongated element with respect to the base member and selective locking of the base angle; and second clamping means for releasably clamping the second arm in the support pivot hole so as to allow adjustment of a support angle of the support member with respect to the elongated element and selective locking of the support angle.

12. The bracket as recited in claim 11, wherein:

the base member includes a base slot generally parallel to the base pivot hole, the base slot communicating with the base pivot hole and extending to the base member outer surface;

the first clamping means includes at least one clamping screw disposed transversely to the base slot and threadingly engaging the base member, so that as the clamping screw is advanced, opposite sides of the base slot will be drawn together, thereby clamping the first arm in the base pivot hole;

the support member includes a support slot generally parallel to the support pivot hole, the support slot communicating with the support pivot hole and extending to the support member outer surface; and the second clamping means includes at least one clamping screw disposed transversely to the support slot and threadingly engaging the support member, so that as the clamping screw is advanced, opposite sides of the support slot will be drawn together, thereby clamping the second arm in the support pivot hole.

13. A method of mounting an instrument, having a heat source, upon a generally horizontal surface, the method comprising the steps of:

mounting a base member on the generally horizontal surface;

mounting a support member on the instrument;

extending an intermediate element, having an elongated element, between the base member and the support member;

connecting a first end of the elongated element to the base member;

extending a second arm generally perpendicularly from a second end of the elongated element;

pivoting the second arm in a support member pivot hole;

adjusting a support angle of the support member with respect to the elongated element; and clamping the second arm releasably in the support pivot hole, thereby selectively locking the support angle.

14. The method as recited in claim 13, further comprising the steps of:

extending a support slot from the support pivot hole to the outer surface of the support member;

engaging the support member threadingly with a clamping screw disposed transversely to the support slot; and drawing opposite sides of the support slot together by advancing the clamping screw, thereby clamping the second arm in the support pivot hole.

15. The method as recited in claim 14, further comprising the steps of:

forming the base member into a ring-shape unitary with the intermediate member;

projecting the intermediate member upward from the base member;

defining the generally horizontal surface as generally horizontal and generally planar;

pivoting the base member slidingly on the generally horizontal surface to adjust the base angle; and mounting the instrument on the bracket adjacent the center of gravity of the instrument, so as to balance the instrument on the bracket.

16. The method as recited in claim 15, further comprising the steps of:

forming a heat sink unitary with the support member by arraying a plurality of fins on an outer surface of the support member;

locating the support member proximal to the heat source; and dissipating heat from the instrument with the heat sink.

17. The method as recited in claim 14, further comprising the steps of:

extending a first arm generally perpendicularly from the first end of the elongated element;

establishing a first plane including the first arm and the elongated element;

establishing a second plane including the second arm and the elongated element, the second plane being generally perpendicular to the first plane;

pivoting the first arm in a base member pivot hole;

adjusting a base angle of the elongated element with respect to the base member;

clamping the first arm releasably in the base pivot hole, thereby selectively locking the base angle.

18. The method as recited in claim 17, further comprising the steps of:

extending a base slot from the base pivot hole to an outer surface of the base member;

engaging the base member threadingly with a clamping screw disposed transversely to the base slot; and drawing opposite sides of the base slot together by advancing the clamping screw, thereby clamping the first arm in the base pivot hole.

19. The method as recited in claim 18, further comprising the steps of:

forming a heat sink unitary with the support member by arraying a plurality of fins on an outer surface of the support member;

locating the support member proximal to the heat source; and dissipating heat from the instrument with the heat sink.

20. An integrated antenna and radio system for portable direct communications to a digital network, the system having an integrated antenna and radio coupled to a bracket for mounting upon a generally horizontal surface and an associated digital network, the bracket comprising:

a base member having an outer surface and an opposite mounting surface for mounting the base member on the generally horizontal surface;

a support member having an outer surface and an opposite mounting surface for mounting the support member on the integrated antenna and radio;

an intermediate member extending between the base member and the support member;

first pivotal means for pivotal attachment of the intermediate member to the base member; and second pivotal means for pivotal attachment of the intermediate member to the support member.

21. The bracket as recited in claim 20, wherein:

the intermediate member includes an elongated element extending between opposite first and second ends, the intermediate member having a first arm extending generally perpendicularly from the elongated element first end, the first arm and the elongated element lying within a first plane, the intermediate member having a second arm extending generally perpendicularly from the elongated element second end, the second arm and the elongated element lying within a second plane generally perpendicular to the first plane;

the base member includes a base pivot hole;

the first pivotal means includes pivotal engagement of the first arm in the base pivot hole;

the bracket further comprises first clamping means for releasably clamping the first arm in the base pivot hole so as to allow adjustment of a base angle of the elongated element with respect to the base member and selective locking of the base angle;

the support member includes a support pivot hole;

the second pivotal means includes pivotal engagement of the second arm in the support pivot hole; and the bracket further comprises second clamping means for releasably clamping the second arm in the support pivot hole so as to allow adjustment of a support angle of the support member with respect to the elongated element and selective locking of the support angle.

22. The bracket as recited in claim 20, wherein:

the base member includes a base slot generally parallel to the base pivot hole, the base slot communicating with the base pivot hole and extending to the base member outer surface;

the first clamping means includes at least one clamping screw disposed transversely to the base slot and threadingly engaging the base member, so that as the clamping screw is advanced, opposite sides of the base slot will be drawn together, thereby clamping the first arm in the base pivot hole;

the support member includes a support slot generally parallel to the support pivot hole, the support slot communicating with the support pivot hole and extending to the support member outer surface;

the second clamping means includes at least one clamping screw disposed transversely to the support slot and threadingly engaging the support member, so that as the clamping screw is advanced, opposite sides of the support slot will be drawn together, thereby clamping the second arm in the support pivot hole; and the support member includes a unitary heat sink having a plurality of fins arrayed on the outer surface of the support member for dissipating heat from the integrated antenna and radio.

* * * * *